United States Patent
Fischer et al.

(10) Patent No.: US 6,471,785 B1
(45) Date of Patent: Oct. 29, 2002

(54) PROCESS FOR PRODUCING A STRIP-SHAPED, MULTI-CORE SUPERCONDUCTOR WITH HIGH-$T_C$ SUPERCONDUCTING MATERIAL AND SUPERCONDUCTOR PRODUCED BY THIS PROCESS

(75) Inventors: Bernhard Fischer, Erlanger; Helmut Helldoerfer, Nuremberg; Stefan Kautz, Rueckersdorf; Jens Mueller, Remscheid; Bernhard Roas, Heidenheim, all of (DE)

(73) Assignee: Vácuumschmelze GmbH, Hanau (DE)

( * ) Notice: Subject to any disclaimer, the term of this patent is extended or adjusted under 35 U.S.C. 154(b) by 0 days.

(21) Appl. No.: 09/581,901

(22) PCT Filed: Dec. 11, 1998

(86) PCT No.: PCT/DE98/03651

§ 371 (c)(1),
(2), (4) Date: Aug. 25, 2000

(87) PCT Pub. No.: WO99/33123

PCT Pub. Date: Jul. 1, 1999

(30) Foreign Application Priority Data

Dec. 22, 1997 (DE) .......................... 197 57 331

(51) Int. Cl.[7] .............................. H01L 39/24
(52) U.S. Cl. .................. 148/96; 29/599; 505/739
(58) Field of Search ..................... 148/96; 29/599; 505/739, 740

(56) References Cited

U.S. PATENT DOCUMENTS 5,045,527 A * 9/1991 Ikeno et al. ................ 505/740
5,246,917 A * 9/1993 Hikata et al. ................ 148/96
5,434,130 A * 7/1995 Hikata et al. ................ 148/96
5,929,000 A * 7/1999 Hahakura et al. ........... 505/231
6,028,036 A * 2/2000 Tenbrink et al. ............ 505/237
6,205,645 B1 * 3/2001 Li et al. ....................... 29/599
6,218,340 B1 * 4/2001 Riley .......................... 29/599

FOREIGN PATENT DOCUMENTS

DE    196 21 070 A    11/1997
DE    44 44 937 A     6/1998
EP    0 509 436 A    10/1992
JP    04 249011 A     1/1993
WO    WO 94/00886     1/1994

OTHER PUBLICATIONS

Utsunomiya, et al., "Critical current density of rolled silver-sheathed Bi(2223) tapes," *Physica C Superconductivity*, vol. 250, pp. 340–348 (1995).

* cited by examiner

*Primary Examiner*—George Wyszomierski
(74) *Attorney, Agent, or Firm*—Dean W. Russell; Kilpatrick Stockton LLP

(57) ABSTRACT

A process is disclosed for producing a strip-shaped superconductor with several conductor cores made of a high-$T_c$ superconducting material and surrounded by a normal conducting material. A conductor blank (2a) produced from a fabricated conductor should be rolled flat at least once. For that purpose, the conductor blank is fed into the gap (7) between two rollers (8, 9) of which the rolling surfaces (8a, 9a) describe a concave, at least approximately elliptical contour at least in the rolling region (8a). The strip-shaped multi-core conductor produced in this way advantageously contains superconducting cores made of a bi-cuprate embedded in an Ag matrix.

7 Claims, 2 Drawing Sheets

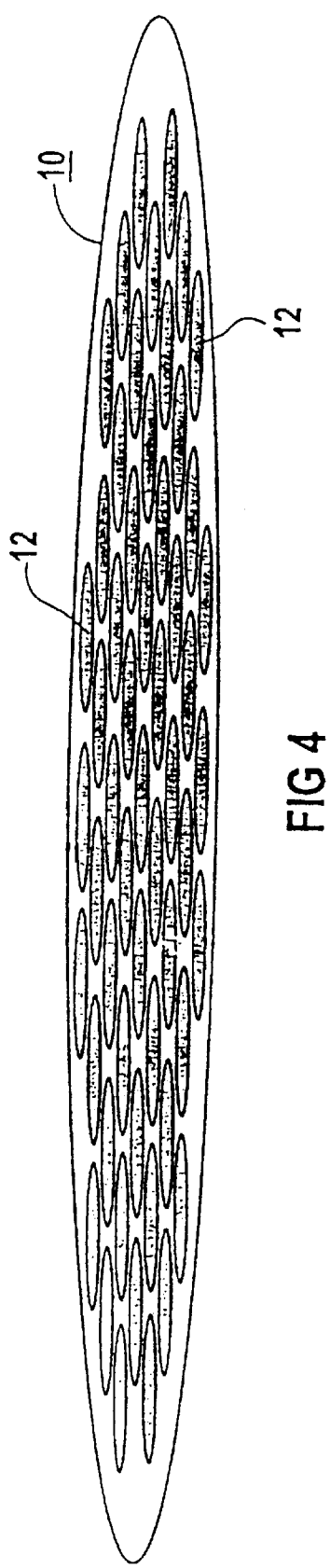
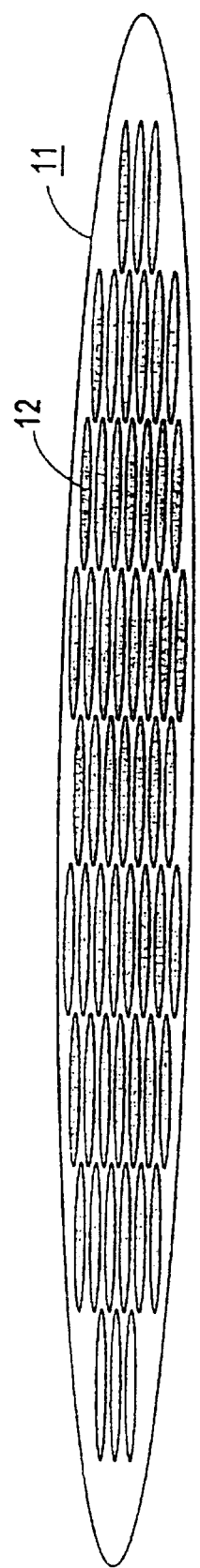
FIG 4
FIG 5

PROCESS FOR PRODUCING A STRIP-SHAPED, MULTI-CORE SUPERCONDUCTOR WITH HIGH-$T_C$ SUPERCONDUCTING MATERIAL AND SUPERCONDUCTOR PRODUCED BY THIS PROCESS

DESCRIPTION

Process for producing a strip-shaped multi-core superconductor with high $T_c$ superconducting material and superconductor produced by this process.

The invention concerns a process for producing a strip-shaped superconductor with multiple conductor cores made of a superconducting material with a metal-oxide high $T_c$ phase and surrounded by a normal conducting material, in which process a fabricated conductor is produced from the powdered precursor material of the superconducting material surrounded by the normal conducting material and this fabricated conductor is subjected to a cross-section reducing and precursor-material compacting deformation process and to at least one annealing treatment, where the deformation process includes at least one rolling step for flattening a conductor blank from the fabricated conductor. The invention further concerns a superconductor produced by this process. A corresponding production process and a superconductor produced by it can be seen for example in the publication "Physica C" Vol. 250, 1995, pps 340–348.

Superconducting metal oxide compounds with high transition temperatures $T_c$ of more than 77° K are known, which are also described as high $T_c$ superconductor materials or HTS materials and in particular permit a liquid nitrogen ($LN_2$) cooling technique. Among such metal oxide compounds are in particular cuprates with special structures for instance especially rare-earth-containing basic types Y—Ba—Cu—O or rare-earth-free basic types Bi—Sr—Ca—Cu—O or (Bi, Pb)—Sr—Ca—Cu—O. Within individual structures such as Bi-cuprates several superconducting high $T_c$ phases can occur, which vary depending on the number of the copper-oxygen network planes or layers within the individual crystalline cells and the different transition temperatures $T_c$.

Attempts have been made using known HTS materials to produce long lengths of superconductor in wire or strip shape. A procedure known to be suitable for this purpose is the so-called "powder-in-tube technique" which is known principally from the production of superconductors with the classic metallic superconducting material $Nb_3Sn$. A similar technique for producing conductors from HTS materials in a tubular sheath or in a matrix of normal conducting material, particularly silver or silver alloy, introduces a normally powder precursor of the HTS material that in general contains as yet none or only a small fraction of the desired superconducting high $T_c$ phase. The fabricated conductor thus obtained is then brought to its desired final dimensions through various deformation processes that can be interrupted as desired by at least one high-temperature heat treatment. In order to achieve or optimize the superconducting properties or to create the desired high $T_c$ phase, the semi-finished conductor thus obtained subsequently undergoes at least one annealing treatment which can be interrupted as desired by a further deformation process.

Combining in conventional fashion high $T_c$ superconductors or their corresponding fabricated conductors or semi-finished conductors enables the creation of conductors with multiple superconducting conductor cores, so-called multi-core or multi-filament superconductors.

Known multi-core superconductors made of HTS material are preferably strip-shaped. Producing a finished-product conductor in this form requires a rolling process according to the literature cited above. Prior to this rolling process, however, the fabricated conductor has to be transformed into a generally cylindrical pre-deformed and pre-compacted compound body with a generally even cross-sectional distribution of conductor cores. This compound body hereinafter referred to as the conductor blank is then transformed by means of a rolling process generally incorporating several rolling steps into the flat strip shape so as to provide the necessary texture for a high current carrying capacity, that is an essentially parallel alignment of the crystalline planes of the superconducting phase. For this purpose the superconductor precursor material must be compacted to the greatest possible extent especially during deformation of the conductor blank through the rolling process.

It is evident, however, that such a process for producing a strip-shaped multi-core superconductor leads to an uneven distribution of individual conductor cores seen in overall cross-sectional perspective. The individual conductor cores here vary in thickness and in width and the differing degrees of compacting of their powder precursor material lead to an uneven distribution of current in the finished-product conductor. The primary cause of this unevenness is the minimum of one rolling step, in which conventionally a pair of rollers is separated by a gap with a rectangular rolling region. Here the central regions of the conductor are pressed especially hard, while the lateral regions experience scarcely any compacting of the precursor material. Thus in the finished-product conductor the central conductor cores carry a higher current than the outer (lateral) conductor cores.

Efforts have been made to overcome this problem by designing in advance a fabricated conductor in rectangular shape (see for example EP 0 509 436 A). The cost of constructing and deforming such a shape of conductor, however, is very high.

The task of the present invention is to design a process with the characteristics initially described so as to enable the production of a strip-shaped multi-core superconductor which particularly in its lateral edge regions possesses an improved current bearing capacity (or critical current density) in relation to conventional designs.

This task is fulfilled according to the present invention in that during at least one rolling step the conductor blank is fed into a gap between two rollers of which the rolling surfaces describe a concave, at least approximately elliptical, contour at least in the rolling region. Here the deviation from the ideal form of an ellipse should be at most large enough that the contour lies within a region that can be described by two concentric ellipses where the outer ellipse possesses a primary axis and a secondary axis that are each about 10% larger than the corresponding axes of the enclosed inner ellipse.

The advantages obtained with this version of the process can be seen especially in that the elliptical contour of the rolling surfaces, also known as the rolling track, provides a more regular alignment of the individual conductor cores and a more extensive broadening of the lateral edge conductors. For while the central region of the conductor blank is rolled to a conventional thickness in standard fashion by means of the elliptical rolling geometry, the lateral edge regions are deformed more strongly to a smaller thickness. Since however the number of conductor cores is lower in the lateral region, the result is a relatively regular geometry. The higher compacting of the conductor cores yields an advantageously higher overall critical current density for the finished-product conductor. This form of the rolling process according to the invention also has a positive influence upon the so-called aspect ratio, that is on the quotient of thickness to width, of the multi-core conductor.

A particularly advantageous arrangement is when during several rolling steps the minimum two roller gaps vary the elliptical contour of their opposing rolling surfaces through the ratio of primary elliptical axis to secondary elliptical axis. This arrangement permits the contour to be adjusted with each rolling step to fit the increasing broadening of the conductor blank.

The strip-shaped multi-core superconductor produced according to the invention thus has to its advantage an at least approximately elliptical cross-section. The permissible deviation from an elliptical shape depends on the contour of the rolling surfaces.

Further advantageous versions of the process according to the invention and of the multi-core superconductor produced by it arise from the respective claims.

BRIEF DESCRIPTION OF THE DRAWINGS

The invention is described in further detail with the aid of drawings. These show schematically in FIG. 1: the cross-section of a conductor blank;

FIGS. 4 & 5: cross-sections of finished-product conductors after the rolling process according to the invention.

DETAILED DESCRIPTION OF THE INVENTION

Figure 1:
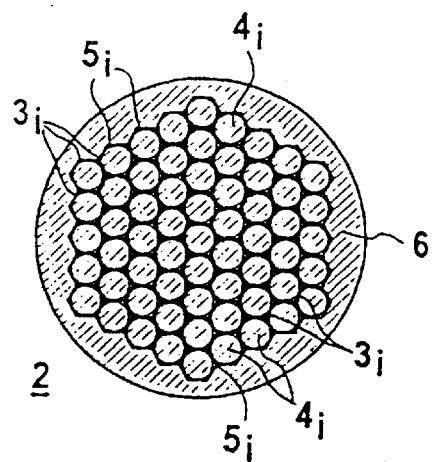

A multi-core conductor produced according to the invention hereinafter referred to as a finished-product conductor displays a long strip-shaped compound body that contains an at least substantially phase-pure high $T_c$ superconductor (HTS) material embedded in a matrix of normal conducting material. Suitable HTS materials are practically all known high $T_c$ superconductor materials, preferably rare-earth-free, in particular Bi-containing cuprates with phases of which the transition temperature $T_c$ lies above 77° K, the boiling point of liquid nitrogen ($LN_2$). A relevant example is HTS material of type $(Bi, Pb)_2Sr_2Ca_2Cu_3O_x$, which is used in the following as an example. Production of a suitable HTS conductor can advantageously be done by means of the known powder-in-tube technique (see for example DE 44 44 937 A). Here a powder precursor material that enables formation of the desired superconducting phase or the already formed superconducting material is placed in a first sheath tube whose material serves as matrix material for the finished-product superconductor. The sheath tube is preferably made of a basic material that does not cause any undesired reaction with the components of the HTS material as with oxygen during conductor production and that can be readily deformed. Hence an especially suitable basic material is a silver material that can have either pure silver or silver alloy as principal component (that is, more than 50 weight percent). For example either cold-formed or re-crystallized pure silver can be used, as well as silver produced by powder metallurgy. Dispersion-hardened silver is also suitable.

The construction of the sheath tube and its enclosed core, made for example from the precursor material for the HTS material, can subsequently undergo a series of several, especially cross-section reducing, deformation processes in order to obtain a conductor element from the compacted precursor material. The deformation steps may consist of any known processes such as extrusion molding, stamping, hammering and drawing or combinations thereof. These mechanical treatments can be carried out at room temperature or at elevated temperatures. After these deformation steps the conductor element has the form of a compound body with a generally circular cross-section.

A multi-core conductor is conventionally obtained by bundling several such conductor elements in a larger (second) sheath tube especially of the matrix material. Naturally other pre-deformed or if desired pre-annealed conductors or fabricated conductors can also be placed inside such a sheath tube. The construction thus obtained can subsequently be further compacted before undergoing a flattening process including at least one rolling step. This flattening process yields a strip shape at least substantially conforming to the desired finished product. The multi-core construction as it exists prior to the flattening process is hereinafter referred to as the conductor blank. This conductor blank must still undergo in addition to the flattening process at least one heat treatment or annealing treatment which generally occurs at the end of the flattening process and preferably in an oxygen-containing atmosphere, for example in air. In this way oxygen for producing the desired superconducting phase is to be provided for the precursor material or the restoration of this phase can be ensured.

In general the flattening process consists of several rolling steps. Here in a first rolling step a rough deformation can be performed without heat treatment. To this first rolling step can then be added a so-called thermo-mechanical treatment. In such a treatment a series of further rolling steps is interspersed with intermediate annealing treatment between these steps and concluded with the required final annealing treatment. According to the invention at least one of these rolling steps, preferably at least the final step but especially all steps involving pairs of rollers, should utilize a rolling mill itself of known type with rollers of which the rolling surfaces according to the invention describe a concave, at least approximately elliptical, contour at least in the rolling region (=coverage of the material being rolled). A corresponding rolling process with two steps is described in FIGS. 1 to 3.

FIG. 1 represents an in itself known cross-section (see for example DE 196 21 070 A) through a conductor blank 2 to be deformed according to the invention and combined in a bundling technique with a certain number of conductor elements. Each conductor element here consists of a sheath tube surrounding a for example powder core made of a precursor for the HTS material. The sheath tubes together with a tubular sheath surrounding them form a normal conducting matrix in which are embedded the cores made from the HTS precursor material. In the example represented here, the conductor blank 2 is made from for example 61 conductor elements $3_i$ with cores $4_i$ and sheath tubes $5_i$ in a tubular sheath 6 by means of a bundling technique and cross-section reducing and structure-compacting processes. For the sake of a better overview, the figure represents the outlines of the individual sheath tubes although these will be practically unrecognizable after deformation of the conductor elements into the conductor blank.

Figure 2:
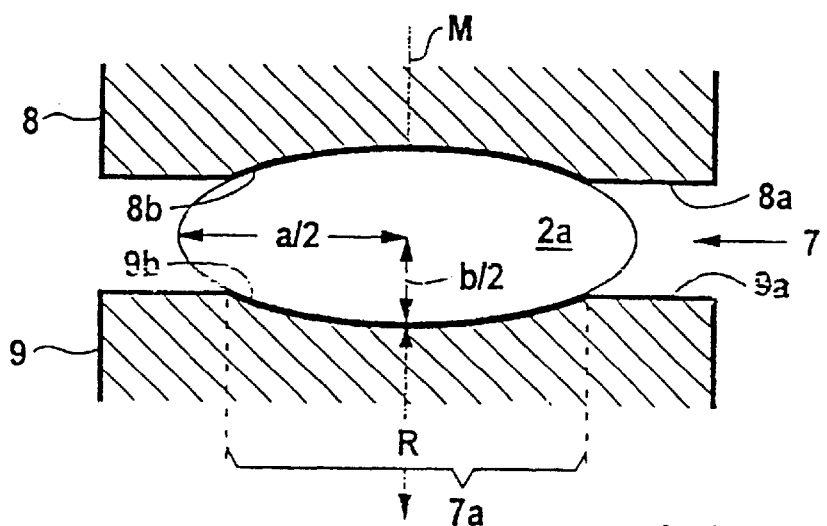
FIG. 2: the cross-section of this conductor blank after a first rolling step according to the invention.

This conductor blank 2 then undergoes a deformation process by rolling with several rolling steps. On at least one rolling step the thermo-mechanical treatment can be undertaken according to the invention. It is however advantageous if at least one rolling step prior to the thermo-mechanical treatment is undertaken in this way. According to FIG. 2 such a rolling step has been undertaken. The figure represents part of a pair of rollers 8 and 9 that delimits a gap 7. These rollers have a cylindrical shape such that their outer cylindrical lateral surfaces 8a and 9a have no continuous constant circular cross-section. Rather the contours 8b and 9b of the lateral surface should be concave, at least approximately elliptical, at least in the rolling region 7a so as to yield a roller radius R tapering to the roller gap center line M. The conductor blank flattened by these types of roller 8 and 9 to a semi-finished conductor is represented in FIG. 2 as 2a.

Figure 3:
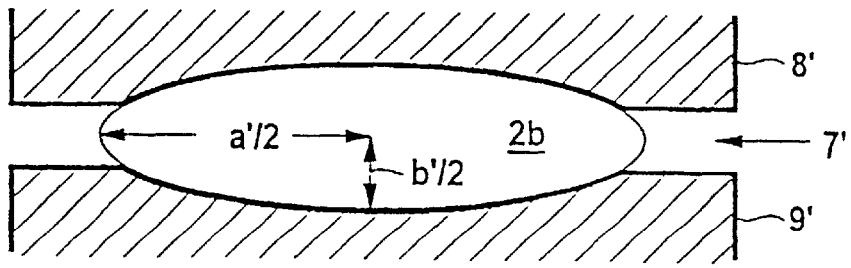
FIG. 3: the cross-section of this conductor blank after a further rolling step according to the invention.

The actual choice of size for the primary axis a and the secondary axis b of the elliptical contour depends on among other things the corresponding degree of deformation and the cross-sectional shape of the object to be rolled. Here it can on occasion be advantageous to deform an object to be rolled (such as a conductor blank) that has a circular cross-section, as for example the conductor blank 2, utilizing rollers of which the elliptical contours have a smaller ratio a/b while a later rolling step utilizes a larger ratio a'/b'. A relevant example is shown in the drawing in FIG. 3 where the rolling step utilizes the ratio a'/b' of the two ellipse axes which is about 3.7 and larger than the ratio a/b in FIG. 2 which is about 2.6. For the two rolling steps the following ratios are advantageous: $1.5=a/b=10$ and $a/b<a'/b'$, preferably $10<a'/b'<25$. Naturally other ranges for a/b and a'/b' can be chosen especially for more than two rolling steps (see for example the schematic representation in FIGS. 2 and 3). The semi-finished conductor produced from the conductor blank after being rolled twice is represented in FIG. 3 by 2b, the rollers by 8' and 9', the gap between them by 7'.

FIGS. 4 and 5 represent possible cross-sectional shapes of strip-shaped finished-product conductors 10 and 11 with 55 conductor cores 12 after deformation of a conductor blank and a thermo-mechanical treatment utilizing rolling steps according to the invention. The finished-product conductors have approximately elliptical cross-sections with in the present example an ellipse axis ratio a/b of about 11.1 and 12.2 respectively.

Based on the examples of construction here represented, it can be seen that the rolling process consists of at least two steps in which the required pairs of rollers have the same diameter disregarding the narrowing in their central sections. Naturally the individual steps can also be undertaken with pairs of rollers that have clearly different diameters.

Moreover an initial step can be undertaken utilizing rollers with straight (not bent) lateral surface contour parallel to the roller axis, for example prior to thermo-mechanical treatment. Subsequent to the ensuing thermo-mechanical treatment there should follow at least one rolling step according to the invention.

What is claimed is:

1. Process for producing a strip-shaped superconductor with multiple conductor cores that includes a superconducting material with a metal oxide high $T_c$ phase and is at least partially surrounded by a normal conducting material, comprising:

producing a fabricated conductor from powder precursor material of the superconducting material, at least partially surrounded by the normal conducting material, subjecting the fabricated conductor to a cross-section reducing and precursor-material compacting deformation process and an annealing treatment, where the deformation process includes at least one step for rolling flat a conductor blank from the fabricated conductor, and thermo-mechanically treating the fabricated conductor to produce a finished superconductor, wherein the treating comprises at least one rolling step with a gap between two rollers of which the rolling surfaces describe a concave, elliptical contour at least in their rolling regions, such that the finished superconductor is obtained with an elliptical cross-section.

2. Process as in claim 1 in which at least two roller gaps exist and differ in the ratio of the primary ellipse axis to the secondary ellipse axis of the elliptical contours of their opposing rolling surfaces.

3. Process as in claim 2 in which the at least one rolling step comprises a first rolling step in which a gap is provided with a ratio of the ellipse axes of between 1.5 and 10 and a second rolling step in which a gap is provided with a ratio of the ellipse axes of between 10 and 25.

4. Process as in claim 2 in which at least one rolling step occurs with rollers having a straight contour of their rolling surfaces and a later rolling step occurs with rollers having elliptical contours of their rolling regions.

5. Process according to claim 2 in which the fabricated conductor is produced by a powder-in-tube technique and the conductor blank is produced from a bundle of such fabricated conductors.

6. Process according to claim 2 in which the normal conducting material includes silver.

7. Process according to claim 6 in which the multiple conductor cores having a high $T_c$ phase are produced from a superconducting Bi-cuprate.

* * * * *